(12) United States Patent
Kim

(10) Patent No.: US 7,205,203 B2
(45) Date of Patent: Apr. 17, 2007

(54) METHOD OF FABRICATING CRYSTALLINE SILICON AND SWITCHING DEVICE USING CRYSTALLINE SILICON

(75) Inventor: Young-Joo Kim, Daegu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 94 days.

(21) Appl. No.: 10/878,117

(22) Filed: Jun. 29, 2004

(65) Prior Publication Data
US 2005/0064675 A1    Mar. 24, 2005

(30) Foreign Application Priority Data
Sep. 24, 2003   (KR) ............... 10-2003-0066130

(51) Int. Cl.
*H01L 21/76* (2006.01)
*H01L 23/544* (2006.01)
(52) U.S. Cl. .............. 438/401; 438/166; 257/64; 257/797
(58) Field of Classification Search ........... 438/30, 438/149, 150, 166, 401; 257/64, 66, 75
See application file for complete search history.

(56) References Cited

U.S. PATENT DOCUMENTS

| 6,713,328 B2* | 3/2004 | Dai et al. ............... 438/151 |
| 6,943,086 B2* | 9/2005 | Hongo et al. ........... 438/308 |
| 2003/0068836 A1* | 4/2003 | Hongo et al. ........... 438/30 |

FOREIGN PATENT DOCUMENTS

| JP | 2002-151407 A | 5/2002 |
| JP | 2003-257862 A | 9/2003 |

OTHER PUBLICATIONS

Robert S. Sposilli, et al., Material Research Society Symp. Proc. vol. 452, pp. 956-957, 1997.

* cited by examiner

*Primary Examiner*—Kevin M. Picardat
(74) *Attorney, Agent, or Firm*—Birch, Stewart, Kolasch and Birch, LLP

(57) ABSTRACT

A method of forming a crystalline silicon layer that includes forming a semiconductor layer of amorphous silicon on a substrate having a first region and a second region at a periphery of the first region; forming at least one concave-shaped alignment key by irradiating a laser beam onto the semiconductor layer in the second region; and crystallizing the semiconductor layer in the first region using the at least one alignment key.

35 Claims, 18 Drawing Sheets align pattern of concave shape semiconductor layer of amorphous silicon

METHOD OF FABRICATING CRYSTALLINE SILICON AND SWITCHING DEVICE USING CRYSTALLINE SILICON

This application claims the benefit of Korean Patent Application No. 2003-0066130, filed on Sep. 24, 2003 in Korea, which is hereby incorporated by reference for all purposes as if fully set forth herein.

BACKGROUND OF THE INVENTION

1. Field of the Invention

The invention pertains to a method of crystallizing amorphous silicon, and more particularly, to a method of fabricating crystalline silicon using an alignment key and a switching device using the crystalline silicon.

2. Description of the Related Art

Flat panel display (FPD) devices have portability and low power consumption, and they have been the subject of much recent research due to the coming of the information age. Among the various types of FPD devices, liquid crystal display (LCD) devices are widely used as monitors for notebook computers and desktop computers because of their high resolution, ability to display colors and superiority in displaying moving images.

In general, an LCD device includes two substrates disposed such that respective electrodes of the two substrates face each other. A liquid crystal layer is interposed between the respective electrodes. When a voltage is applied between the two electrodes, an electric field is generated. The electric field modulates the light transmittance of the liquid crystal layer by reorienting the liquid crystal molecules, thereby displaying images in the LCD device.

Active matrix type display devices are commonly used because of their superior display of moving images. Active matrix-type display devices include pixel regions that are disposed in matrix and a switching element, such as a thin film transistor (TFT), is formed at each pixel region. LCD devices that include TFTs using polycrystalline silicon (p-Si) have recently been widely researched and developed. In an LCD device using polycrystalline silicon, both a display region TFT and a driving circuit may be formed on one substrate. Moreover, since an additional process of connecting the TFT of the display region and the driving circuit is not necessary, the total fabrication process for the LCD device is simplified. Since the field effect mobility of polycrystalline silicon is several-hundred times as great as that of amorphous silicon, the LCD device using polycrystalline silicon has a short response time and high stability against heat and light.

Amorphous silicon may be crystallized into polycrystalline silicon. A laser annealing method, where a laser beam is irradiated onto an amorphous silicon film, finds wide use as a crystallization method. However, since the surface temperature of the irradiated amorphous silicon film reaches about 1400° C., the surface of the silicon film is apt to oxidize at its top surface. Particularly, since the laser beam irradiates several times during the laser annealing method, silicon oxide ($SiO_2$) may be created on the top surface of the silicon film when the irradiation of the laser beam is performed under ambient air. Accordingly, the laser beam may be irradiated under a vacuum of about $10^{-7}$ to $10^{-6}$ torr. To solve the problems of the laser annealing method, a sequential lateral solidification (SLS) method using a laser beam has been suggested and researched.

The SLS method utilizes the phenomenon that grains of a silicon film grow along a direction perpendicular to a border surface of a liquid phase region and a solid phase region of the silicon film. In the SLS method, grains grow along one lateral direction by adjusting an energy density and an irradiation range of a laser beam and moving a laser beam (Robert S. Sposilli, M. A. Crowder, and James S. Im, Material Research Society Symp. Proc. Vol. 452, pages 956~957, 1997).

FIG. 1A shows a schematic plane view of a mask used in a sequential lateral solidification method according to the related art, and FIG. 1B shows a schematic plane view of a semiconductor layer crystallized using the mask of FIG. 1A.

FIG. 1A shows a mask 10 for an SLS method that includes a slit pattern 12 having a width of several micrometers, and a laser beam having a width of several micrometers may therefore be irradiated onto a semiconductor layer. Even though not shown in FIG. 1A, a gap between adjacent slit patterns 12 may be several micrometers. For example, the slit pattern 12 may have a width of about 2 μm to about 3 μm.

In FIG. 1B, a laser beam (not shown) irradiates onto a semiconductor layer 20 of amorphous silicon through the slit pattern 12 of the mask 10 in FIG. 1A. A region 22 of the semiconductor layer 20 irradiated by the laser beam completely melts, and grains 24a and 24b grow while the melted silicon is solidified. The grains 24a and 24b laterally grow from both ends of the irradiated region 22 and stop growing at a central portion of the irradiated region 22 to form a grain boundary 28b where the grains 24a and 24b meet. Even though not shown in FIGS. 1A and 1B, the mask 10 has multiple slit patterns 12, and a crystallized portion corresponding to the mask 10 may be referred to as a unit crystallization area. The semiconductor layer 20 of amorphous silicon may fully crystallize by repeating the irradiation of the laser beam onto different regions of the semiconductor layer 20 including the irradiated region 22.

FIG. 2 shows a schematic plane view of a semiconductor layer crystallized by a sequential lateral solidification method according to the related art. In FIG. 2, a semiconductor layer of polycrystalline silicon includes multiple unit crystallization areas 30. First and second overlapping areas 40 and 50, where a laser beam is repeatedly irradiated, are created between the adjacent unit crystallization areas 30. The first overlapping area 40 runs along a vertical direction between two adjacent unit crystallization areas 30, and the second overlapping area 50 forms along a horizontal direction between two adjacent unit crystallization areas 30. Since the laser beam is irradiated onto the first and second overlapping areas 40 and 50 several times, the first and second overlapping areas 40 and 50 have non-uniform crystallization. These non-uniformly crystallized portions cause a reduction in the display quality of an LCD device, especially when the non-uniform portions are used to form a TFT of a display region in the LCD device.

SUMMARY OF THE INVENTION

The invention pertains to a method of fabricating polycrystalline silicon and a switching device using the fabricated polycrystalline silicon, which substantially obviates one or more of problems due to limitations and disadvantages of the related art.

An object of the invention is to provide a method of fabricating polycrystalline silicon, and a switching device using the fabricated polycrystalline silicon, wherein the formation of non-uniformly portions in a semiconductor layer is reduced or eliminated and the fabrication time is shortened.

Another object of the invention is to provide a crystallization method where a selected portion of a layer is crystallized using a mask and an alignment key.

Another object of the invention is to provide a crystallization method and a photolithographic method using an alignment key for both the crystallization method and the photolithographic method, and to provide a method of forming the alignment key.

Additional features and advantages of the invention will be set forth in the description which follows, and in part will be apparent from the description, or may be learned by practice of the invention. The objectives and other advantages of the invention will be realized and attained by the structures particularly pointed out in the written description and claims hereof as well as the appended drawings.

The invention, in part, provides a method of forming a crystalline silicon layer that includes forming a semiconductor layer of amorphous silicon over a substrate having a first region and a second region at a periphery of the first region; forming at least one alignment key having a concave shape by irradiating a laser beam onto the semiconductor layer in the second region; and crystallizing the semiconductor layer in the first region using the at least one alignment key.

The invention, in part, provides a method of forming an active layer for a switching element that includes forming a semiconductor layer of amorphous silicon over a substrate having a first region and a second region at a periphery of the first region; forming at least one alignment key having a concave shape by irradiating a laser beam onto the semiconductor layer in the second region; crystallizing the semiconductor layer in the first region using the at least one alignment key; and patterning the semiconductor layer in the first region using the at least one alignment key to form the active layer of crystalline silicon. The step of the patterning of the semiconductor layer can include an exposure step of recognizing the alignment key by scanning.

The invention, in part, provides a method of forming a crystalline silicon layer that includes forming a semiconductor layer of amorphous silicon over a substrate having a first region and a second region at a periphery of the first region; forming at least one alignment key having a concave shape using a first mask by irradiating a laser beam onto the semiconductor layer in the second region; and crystallizing the semiconductor layer in the first region using the at least one alignment key and a second mask. The first mask can include rectangular shaped transmissive areas spaced apart from each other.

The invention, in part, provides a method of forming an active layer for a switching element that includes forming a semiconductor layer of amorphous silicon over a substrate having a first region and a second region at a periphery of the first region; forming at least one alignment key having a concave shape using a first mask by irradiating a laser beam onto the semiconductor layer in the second region; crystallizing the semiconductor layer in the first region using the at least one alignment key and a second mask; and patterning the semiconductor layer in the first region using the at least one alignment key to form the active layer of crystalline silicon.

The invention, in part, provides a method for fabricating a switching element that includes forming a semiconductor layer of amorphous silicon over a substrate having a first region and a second region at a periphery of the first region; forming at least one alignment key having a concave shape by irradiating a laser beam onto the semiconductor layer in the second region; crystallizing the semiconductor layer in the first region using the at least one alignment key; patterning the semiconductor layer in the first region using the at least one alignment key to form an active layer of crystalline silicon including a channel region and source and drain regions at sides of the channel region; forming a gate insulating layer over the active layer; forming a gate electrode over the gate insulating layer; forming an interlayer insulating layer over the gate electrode, the interlayer insulating layer including a first contact hole exposing the source region and a second contact hole exposing the drain region; and forming source and drain electrodes over the interlayer insulating layer, the source electrode being connected to the source region through the first contact hole and the drain electrode being connected to the drain region through the second contact hole.

The invention, in part, provides a method of forming a polycrystalline semiconductor layer that includes forming a semiconductor layer of amorphous silicon over a substrate having a first region and a second region at a periphery of the first region; ablating the semiconductor layer in the second region to form at least one alignment key having a concave shape; and crystallizing the semiconductor layer in the first region using the at least one alignment key.

The invention, in part, provides a switching element that includes a substrate having a first region and a second region at a periphery of the first region; at least one alignment key having a concave shape in the second region; an active layer of crystalline silicon in the first region, the active layer including a channel region and source and drain regions at sides of the channel region; a gate insulating layer over the active layer; a gate electrode over the gate insulating layer; an interlayer insulating layer over the gate electrode, the interlayer insulating layer including a first contact hole exposing the source region and a second contact hole exposing the drain region; and source and drain electrodes over the interlayer insulating layer, the source electrode being connected to the source region through the first contact hole and the drain electrode being connected to the drain region through the second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to the preferred embodiments of the invention, which are illustrated in the accompanying drawings. Wherever possible, similar reference numbers will be used throughout the drawings to refer to the same or like parts.

Figure 1A:
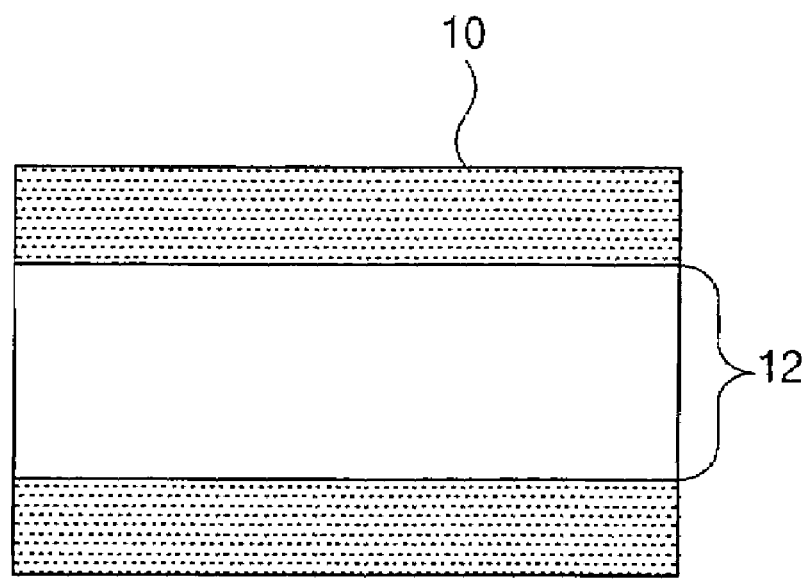
FIG. 1A shows a schematic plane view of a mask used in a sequential lateral solidification method according to the related art.
Figure 1B:
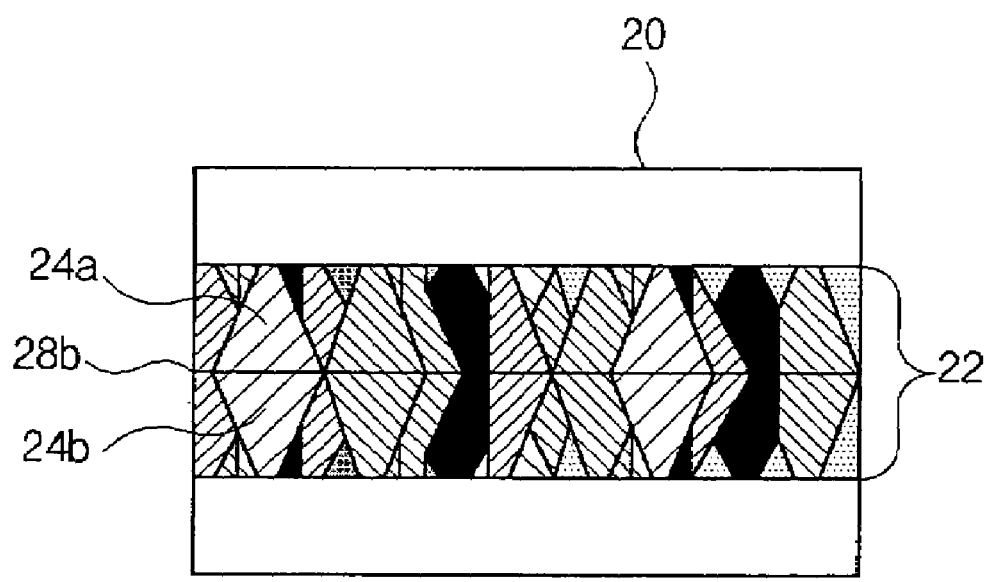
FIG. 1B shows a schematic plane view of a semiconductor layer crystallized using the mask of FIG. 1A.
Figure 2:
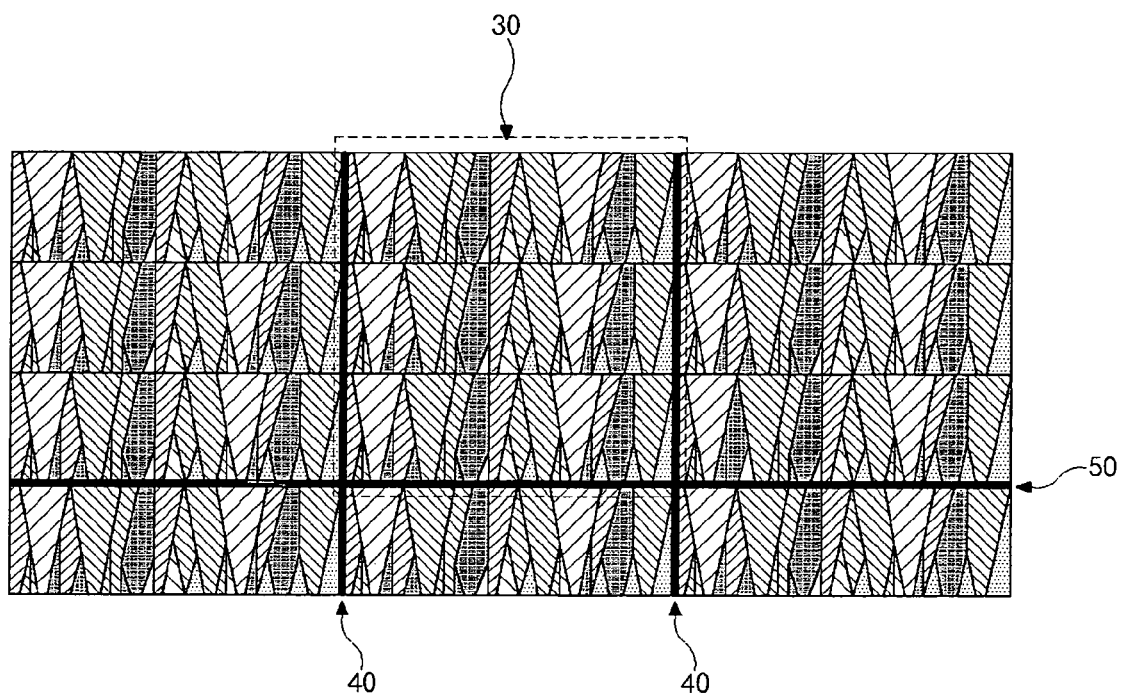
FIG. 2 shows a schematic plane view of a semiconductor layer crystallized by a sequential lateral solidification method according to the related art.
Figure 3A:
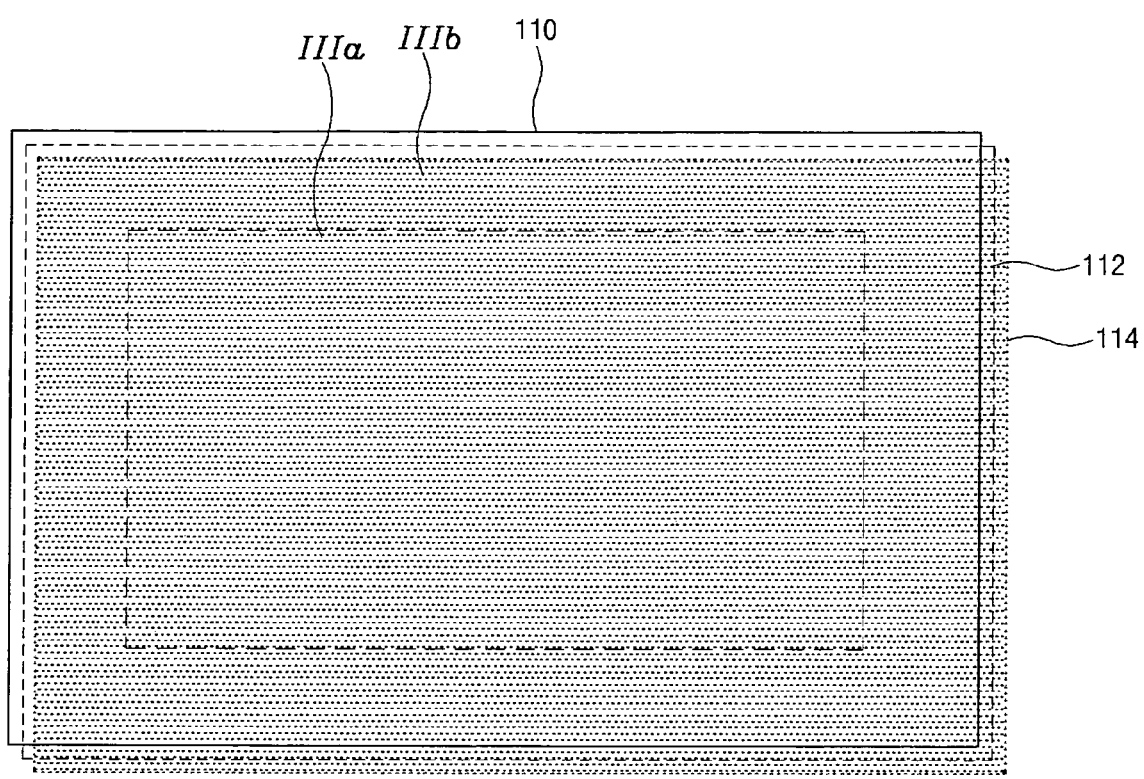
FIGS. 3A to 3C show schematic plane views showing a process of fabricating a semiconductor layer of crystalline silicon according to a first embodiment of the invention.
Figure 3B:
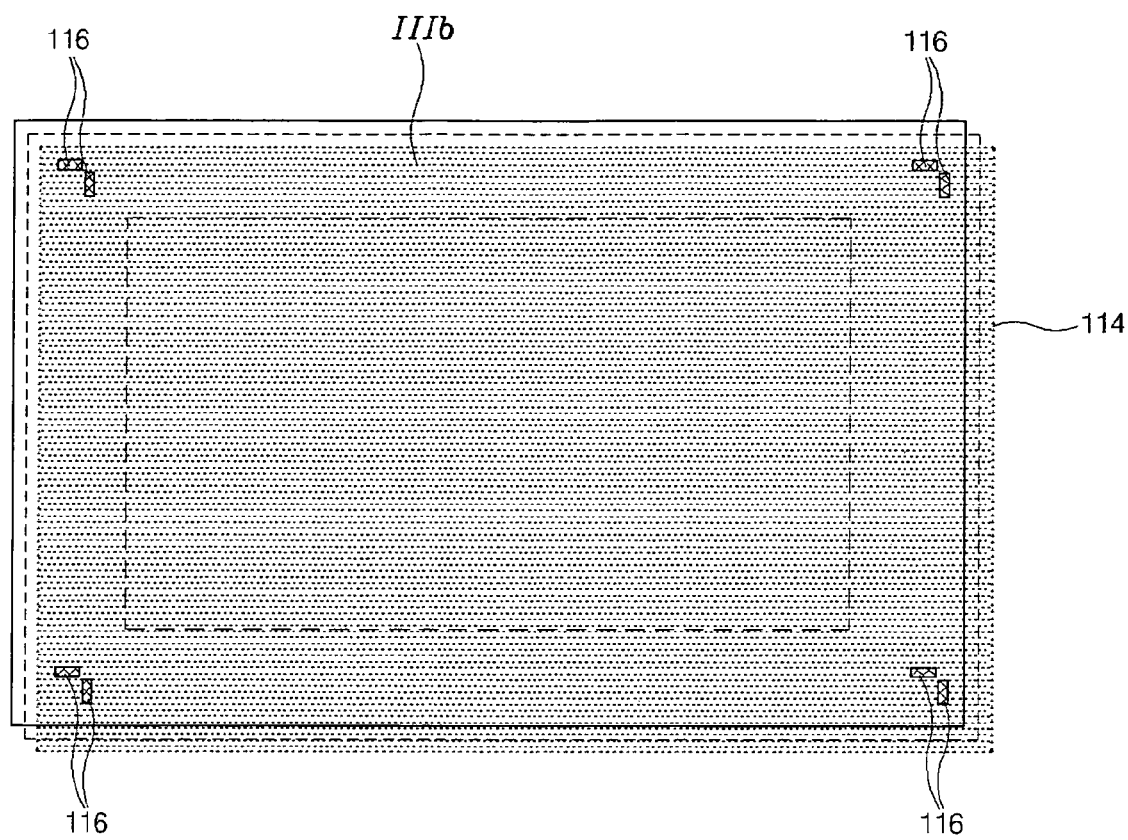
Figure 3C:
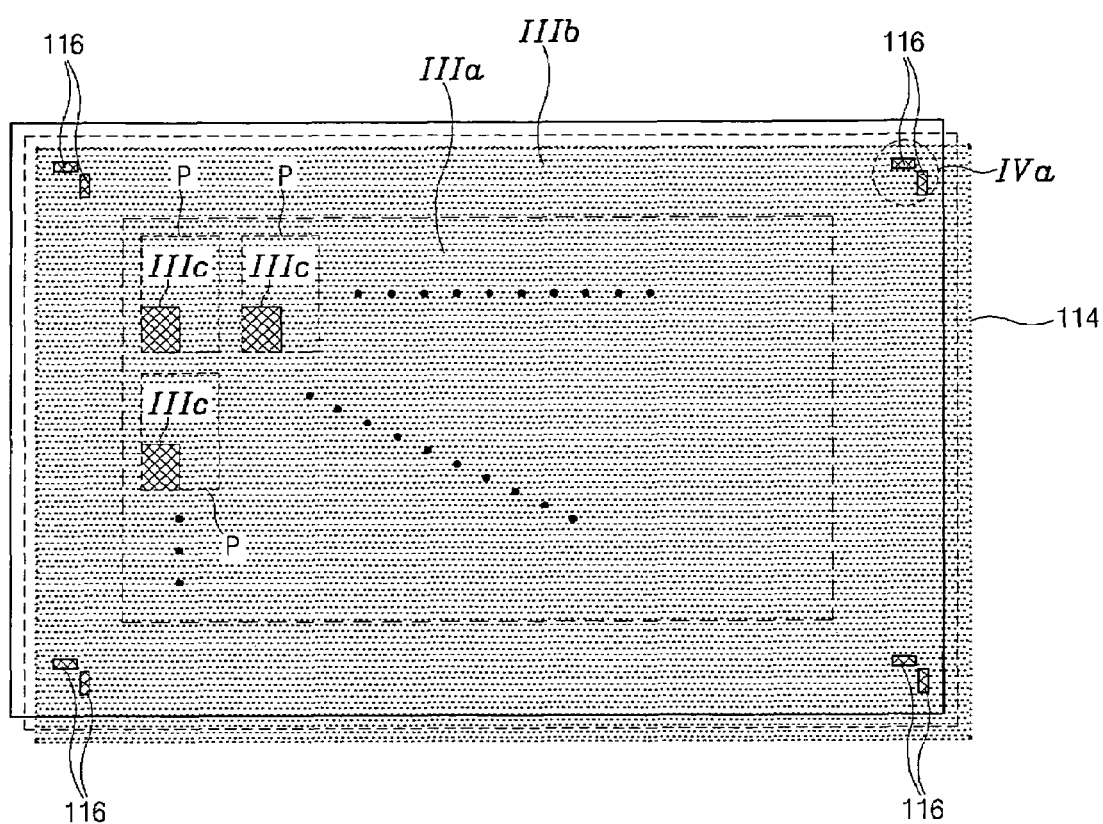

FIGS. 3A to 3C illustrate schematic plane views showing a process of fabricating a semiconductor layer of crystalline silicon according to a first embodiment of the invention.

FIG. 3A shows a buffer layer 112 and a semiconductor layer 114 of amorphous silicon that are sequentially formed on a substrate 110 having a first region "IIIa" and a second region "IIIb" at the periphery of the first region "IIIa."

FIG. 3B shows an alignment key 116 that is formed at each corner portion in the second region "IIIb" of the substrate 110 by crystallizing a portion of the semiconductor layer 114 of amorphous silicon. Accordingly, the semiconductor layer 114 corresponding to the alignment key 116 of the second region "IIIb" crystallizes, but the semiconductor layer 114 in other portions of the second region "IIIb" does not crystallize. For example, the alignment key 116 of crystalline silicon has a shape of "]" in the first embodiment. The alignment key 116 may have various shapes such as "└," "S," "E," "ī," "+" and "◇" in another embodiment. The alignment key is not restricted to these shapes, and any appropriate shape can be used.

In FIG. 3C, portions of the amorphous silicon semiconductor layer 114 in the first region "IIIa" are selectively crystallized using the alignment key 116 as a reference point. The first region "IIIa" includes multiple pixel regions "P." The pixel region "P" may be a unit region for displaying images, and may include a third region "IIIc" where an active layer of a switching element forms during a subsequent process. The pixel regions "P" can be pixel regions of a display device such as a liquid crystal display device, and the third region "IIIc" can be a thin film transistor. The amorphous silicon semiconductor layer 114 in the third region "IIIc" may be selectively crystallized, and the amorphous silicon semiconductor layer 114 in other portions of the first region "IIIa" are not crystallized. For example, the amorphous silicon semiconductor layer 114 in the third region "IIIc" may be crystallized through a sequential lateral solidification (SLS) method using a laser beam having an energy density corresponding to a complete melting regime of amorphous silicon.

The semiconductor layer 114 is selectively crystallized using the alignment key 116 as a reference, and the position of the grain boundary in the third region "IIIc" may easily be controlled so that the crystallization of the semiconductor layer 114 in the other portions of the first region "IIIa" corresponding to a pixel electrode may be prevented. Accordingly, defects in the buffer layer 112 (of FIG. 3A) or the substrate 110 (of FIG. 3A) due to the crystallization of the semiconductor layer 114 are prevented, and distorted or stained display images resulting from these defects is prevented.

Figure 4A:
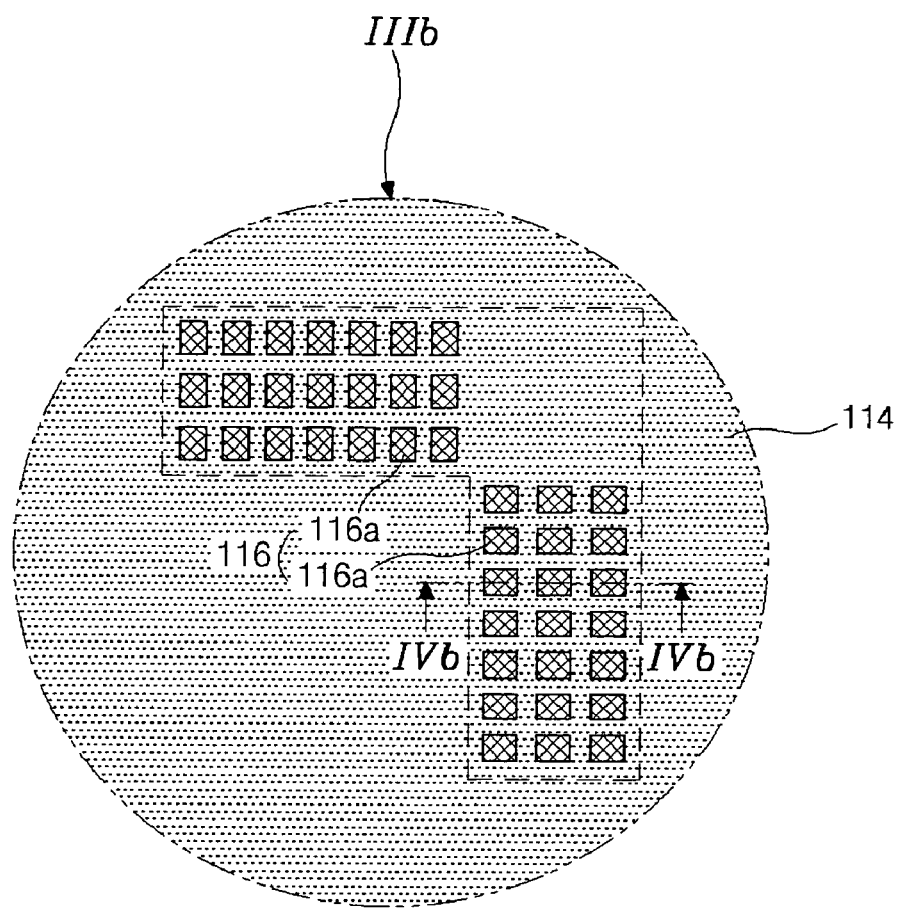
FIG. 4A shows a magnified view of an alignment key, showing a portion "IVa" of FIG. 3C.
Figure 4B:
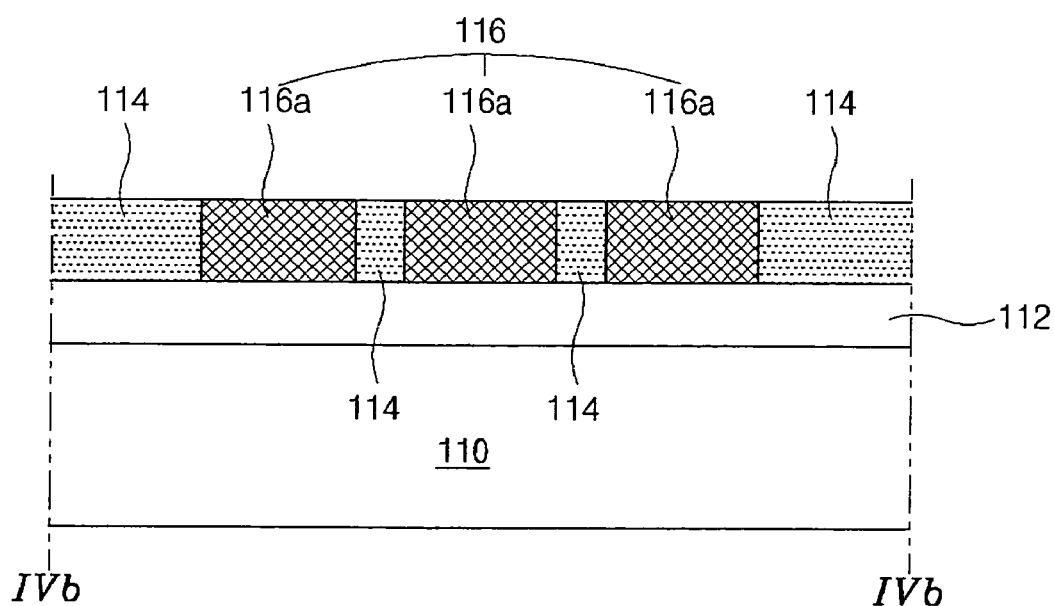
FIG. 4B shows a schematic cross-sectional view of an alignment key, taken along a line "IVb—IVb" of FIG. 4A.

FIG. 4A depicts a magnified view of an alignment key, showing a portion "IVa" of FIG. 3C, and FIG. 4B shows a schematic cross-sectional view of an alignment key, taken along a line "IVb—IVb" of FIG. 4A.

In FIG. 4A, an alignment key 116 in the second region "IIIb" includes multiple alignment patterns 116a of crystalline silicon to comprise a shape of "]." The semiconductor layer 114 between the adjacent align patterns 116a does not crystallize. Accordingly, the semiconductor layer 114 between the adjacent alignment patterns 116a includes amorphous silicon, while the semiconductor layer 114 corresponding to the alignment key 116 includes crystalline silicon.

FIG. 4B shows a buffer layer 112 that is formed on a substrate 110 and a semiconductor layer 114, including an alignment key 116, that is formed on the buffer layer 112. The alignment key 116 includes multiple alignment patterns 116a, and the alignment patterns 116a are spaced apart from each other. The semiconductor layer 114 between the adjacent alignment patterns 116a includes amorphous silicon. The semiconductor layer 114 corresponding to i.e., containing, the multiple alignment patterns 116a has the same height as the semiconductor layer 114 between the adjacent alignment patterns 116a. In other words, the semiconductor layer 114 has a flat top surface without step portions. However, the top surface need not be absolutely flat in order to practice the invention.

Generally, in an exposure apparatus for a photolithographic process, a mask is aligned to a substrate by using an alignment key as a reference. However, as shown in FIG. 4B, since the alignment key 116 of the first embodiment does not have step portions (i.e., it is not projected out from the substrate surface), the alignment key 116 of the first embodiment can not be used in a photolithographic process. Accordingly, photolithographic processing requires an additional or separate alignment key, and process time and production cost thereby increases. A second embodiment of the invention provides an alignment key that can be used in both the crystallization process and the photolithographic process.

FIGS. 5A to 5D are schematic plane views showing a process of fabricating a semiconductor layer of crystalline silicon according to a second embodiment of the invention.

Figure 5A:
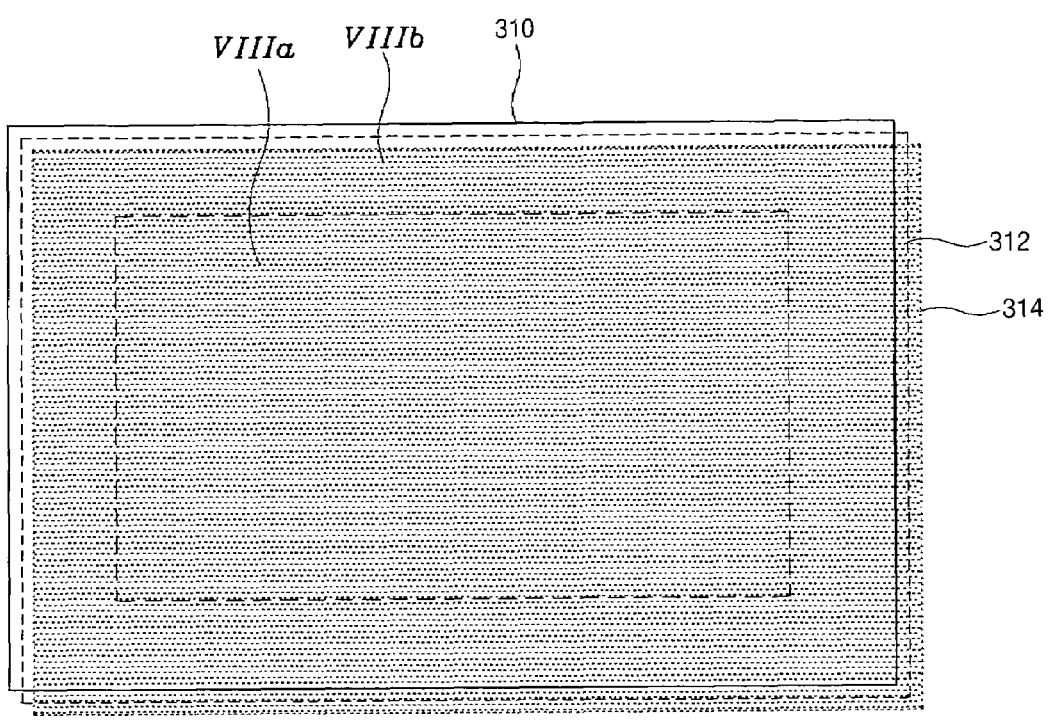
FIGS. 5A to 5D show schematic plane views depicting a process of fabricating a semiconductor layer of crystalline silicon according to a second embodiment of the invention.

FIG. 5A shows a buffer layer 312 and an amorphous silicon semiconductor layer 314 that are sequentially formed on a substrate 310 having a first region "VIIIa" and a second region "VIIIb" at the periphery of the first region "VIIIa."

Figure 5B:
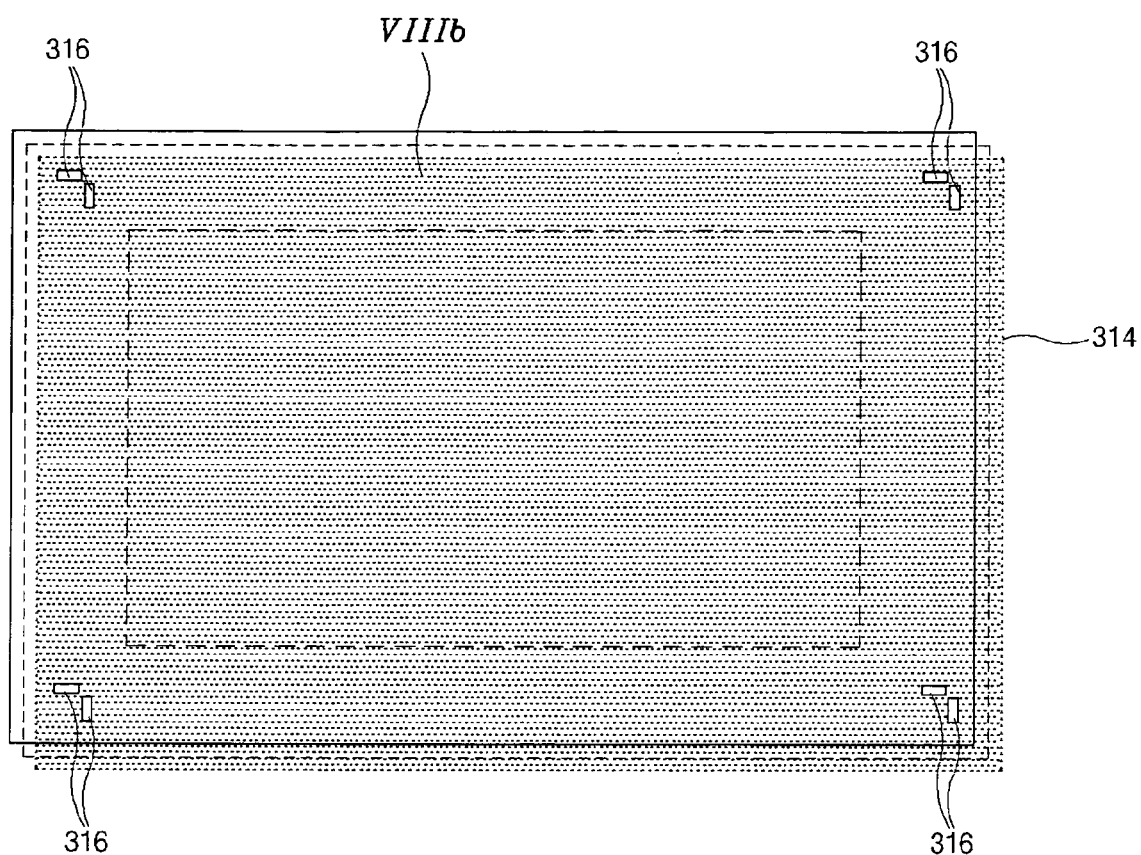

FIG. 5B shows that a portion of the semiconductor layer 314 in the second region "VIIIb" is removed to form an alignment key 316 by irradiating a laser beam having an energy density higher than the energy corresponding to a complete melting regime. This technique of removing silicon may be referred to as an ablation.

Generally, when a laser beam irradiates onto a semiconductor layer, an energy density band of the laser beam may divide into four regimes according to the state of the semiconductor layer directly after irradiation: i) a partial melting regime, ii) a nearly complete melting regime, iii) a complete melting regime, and iv) an ablation regime. When irradiating a laser beam having a first energy density corresponding to the partial melting regime, an upper portion of the semiconductor layer melts and a lower portion of the semiconductor layer does not melt, thereby obtaining a crystalline structure having a small grain size in the upper portion. When irradiating a laser beam having a second energy density corresponding to the nearly complete melting regime, most of the semiconductor layer melts, thereby obtaining a crystalline structure having a large grain size. Non-melted portions exist at an interface between the semiconductor layer and the substrate, and these non-melted portions function as a seed for crystallization. Even though the grain size is large, the distribution of seed is not uniform, and the energy band width corresponding to the nearly complete melting regime is too narrow. When irradiating a laser beam having a third energy density corresponding to the complete melting regime, the entire semiconductor layer melts. Under this regime, nucleation uniformly occurs (homogeneous nucleation). However, the nucleation seeds compete with each other, and a large-sized grain is therefore not obtained and uniform fine grains are instead obtained. When irradiating a laser beam having a fourth energy density corresponding to the ablation regime, the semiconductor layer is removed by evaporation. In addition, a laser beam having an energy density corresponding to the ablation may be used for cutting or deposition.

The fourth energy density corresponding to the ablation regime is higher than the third energy density corresponding to the complete melting regime. In FIG. 5B, a laser beam having an energy density corresponding to the ablation regime irradiates onto a portion of the semiconductor layer 314 in the second region "VIIIb," and then the irradiated portion of the semiconductor layer 314 is removed by evaporation to form an alignment key 316.

Since the semiconductor layer 314 in the irradiated portion is removed, the alignment key 316 has a concave shape, and the buffer layer 312 is exposed through the alignment key 316. The energy density for ablation may be higher than an energy density corresponding to a complete melting regime of the amorphous silicon semiconductor layer 314 and lower than an energy density corresponding to a critical distance of about 1 µm. When a laser beam having a first size irradiates onto a semiconductor layer, a melted portion of the semiconductor layer has a second size larger than the first size. Accordingly, a boundary of the second size may surround and be spaced apart from that of the first size, and a distance from the boundary of the first size to the boundary of the second size may be referred to as the critical distance. As the energy density of the laser beam increases, the critical distance also increases. Thus, the critical distance can be longer than about 1 µm when irradiating a laser beam having a relatively high energy density corresponding to an ablation regime.

For example, a laser beam having an energy density of about 549 mJ/pulse can be used to form an alignment key. The alignment key 316 may be formed at each corner portion in the second region "VIIIb" of the substrate 310. In addition, the alignment key 316 may have a shape of "]." The alignment key 316 may have various shapes such as "[," "S," "E," "ī," "+" and "◇" in another embodiment. The alignment key 316 is not restricted to these shapes, and any appropriate shape may be used.

Figure 5C:
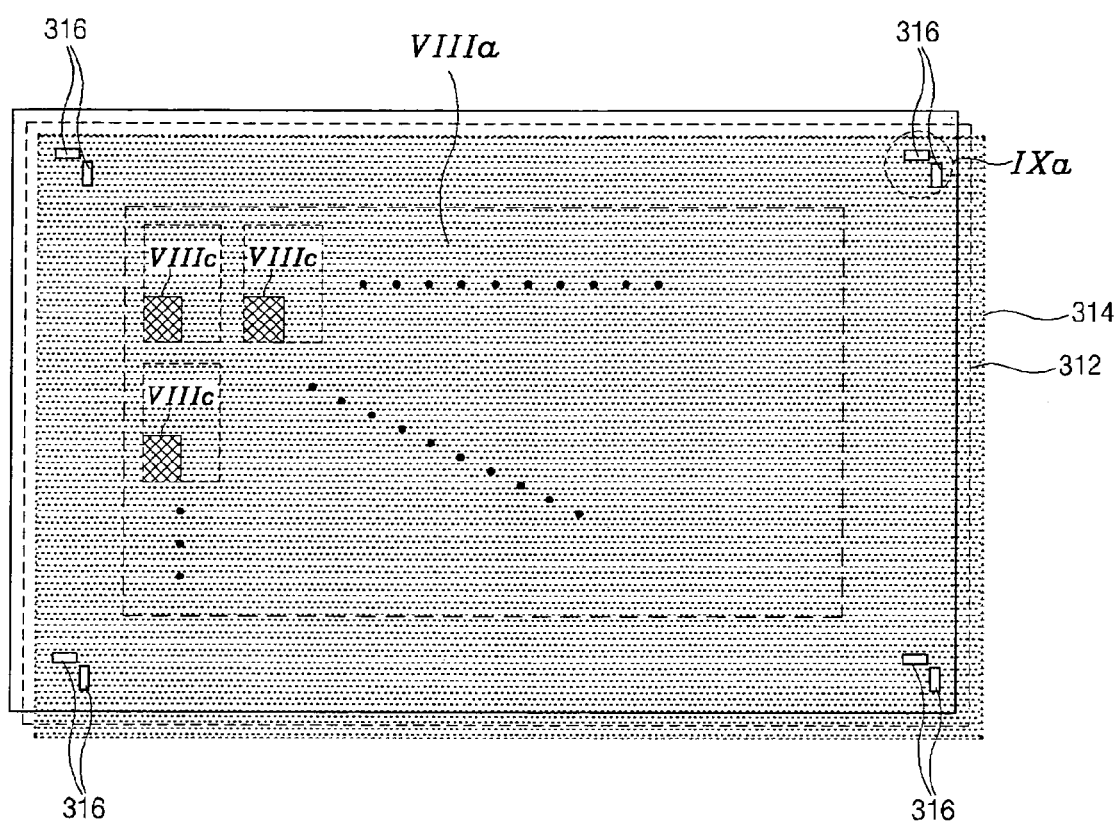

In FIG. 5C, portions of the semiconductor layer 314 in the first region "VIIIa" are selectively crystallized using the concave-shaped alignment key 316 as a reference. The first region "VIIIa" includes multiple pixel regions, which is a unit region for displaying images. The pixel region may include a third region "VIIIc" where an active layer of a switching element is formed during a subsequent processing. The pixel region can be a pixel region of a display device such as a liquid crystal display device, and the third region "VIIIc" can be a thin film transistor. The amorphous silicon semiconductor layer 314 in the third region "VIIIc" may be selectively crystallized, and the amorphous silicon semiconductor layer 314 in other portions of the first region "VIIIa" may not be crystallized. For example, the amorphous silicon semiconductor layer 314 in the third region "VIIIc" may be crystallized through a sequential lateral solidification (SLS) method by using a laser beam having an energy density corresponding to a complete melting regime of the amorphous silicon.

Figure 5D:
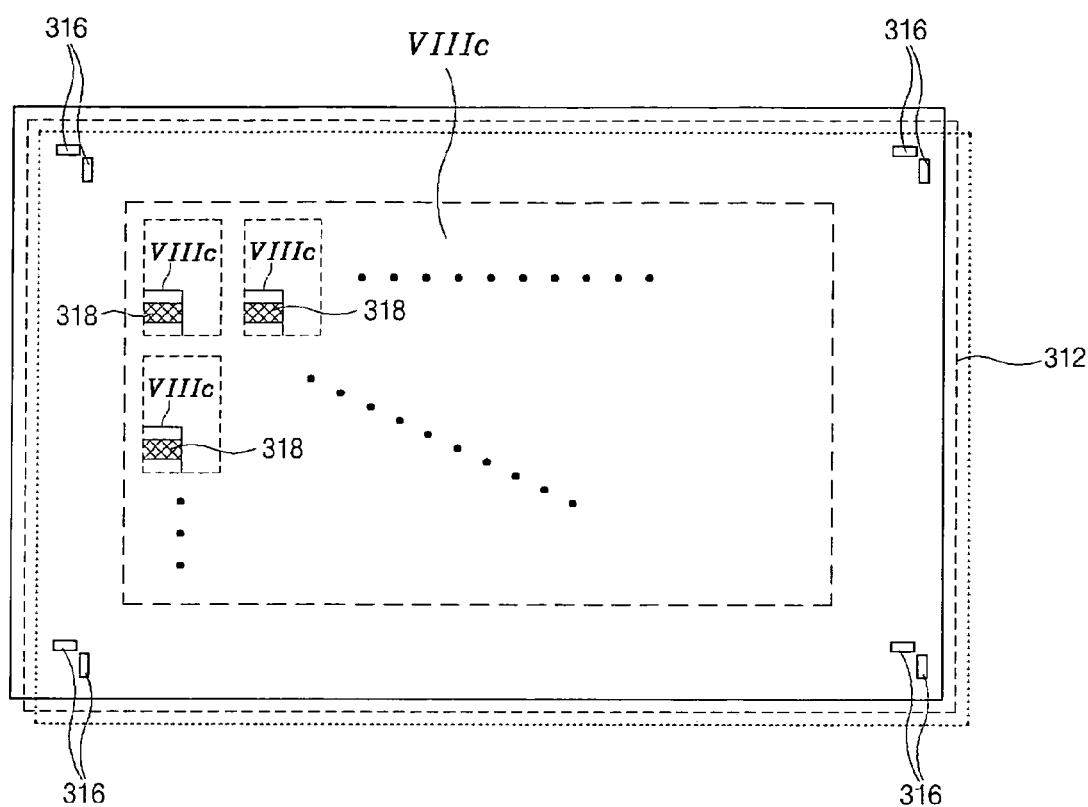

In FIG. 5D, the polycrystalline silicon semiconductor layer 314 in the third region "VIIIc" may be patterned through a photolithographic process using the alignment key 316 as a reference to form an active layer 318 for a switching element. Even though not shown in FIG. 5D, the photolithographic process may include a step of forming a photoresist (PR) layer over the semiconductor layer 314, a step of aligning a photo mask with the semiconductor layer 314 by using the alignment key 316, a step of exposing the PR layer through the photo mask, a step of developing the PR layer to form a PR pattern and a step of etching the semiconductor layer 314 using the PR pattern as an etch mask to form the active layer 318. A photolithographic exposure apparatus generally aligns a photo mask to a substrate by detecting step portions of an alignment key. Since the concave-shaped alignment key 316 has step portions, the alignment key 316 may be used as a reference during the exposure step of the photolithographic process for the active layer 318.

In the first embodiment, a crystallization apparatus projects a laser beam having an energy density corresponding to an ablation regime is irradiated onto portions of an amorphous silicon semiconductor layer before the semiconductor layer in other portions is crystallized. Accordingly, a concave-shaped an alignment key having step portions is obtained without an additional etching step, and the alignment key may be used in a subsequent photolithographic process forming an active layer. Since the alignment key finds utilization both in a crystallization process and a photolithographic process, the production cost is reduced and the fabrication process becomes simpler, thereby improving production yield.

Figure 6A:
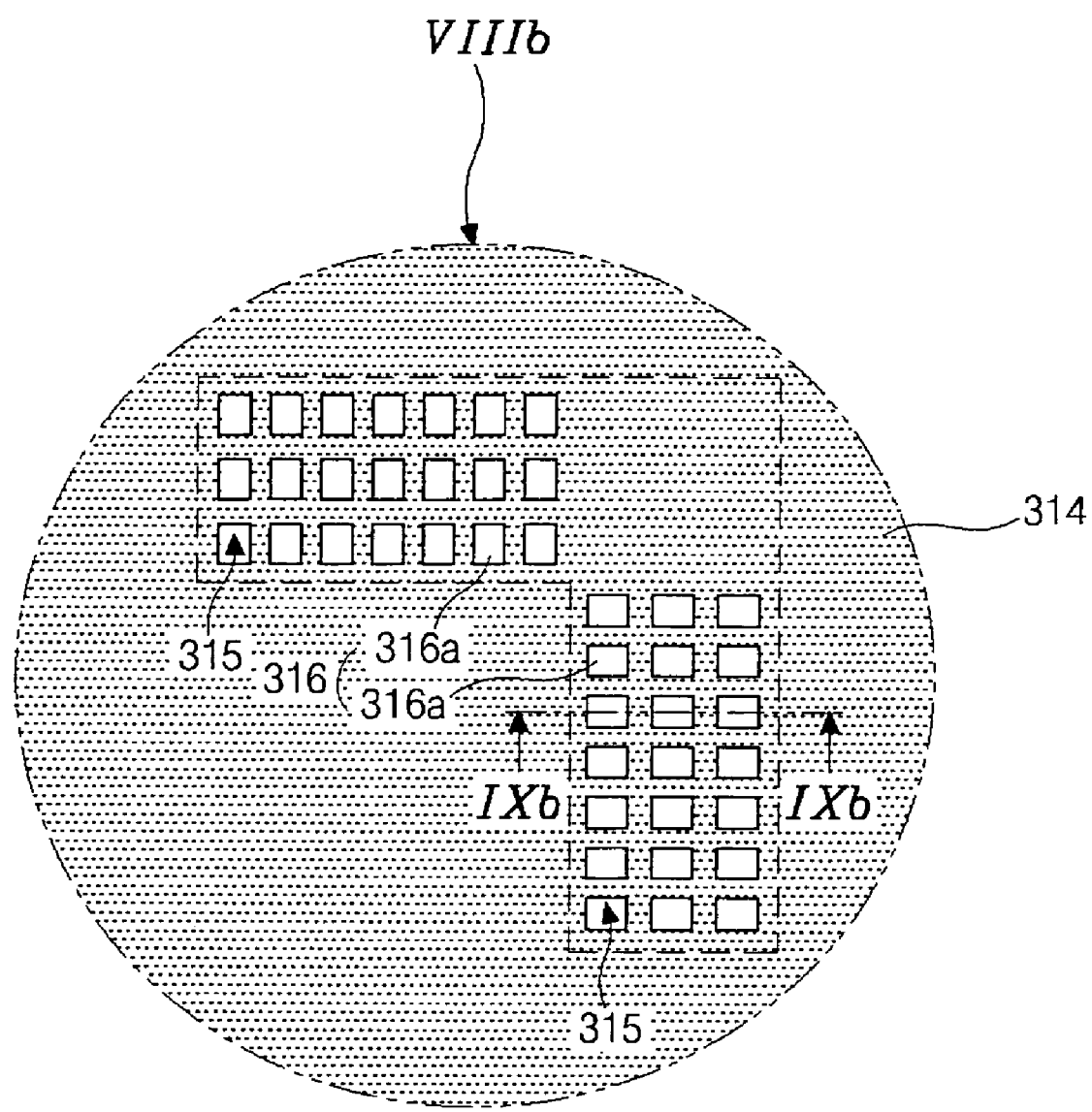
FIG. 6A shows a magnified view of an alignment key, showing a portion "IXa" of FIG. 5D.
Figure 6B:
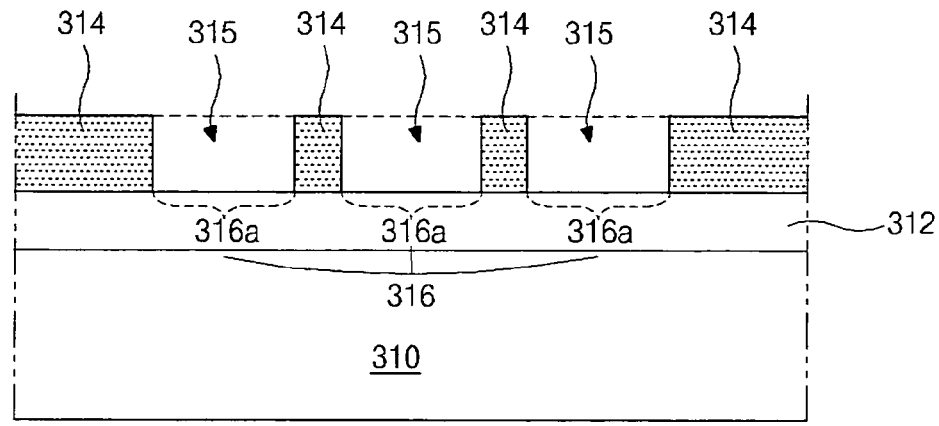
FIG. 6B shows a schematic cross-sectional view of an alignment key, taken along a line "IXb—IXb" of FIG. 6A.

FIG. 6A shows a magnified view of an alignment key, showing a portion "IXa" of FIG. 5C and FIG. 6B shows a schematic cross-sectional view of an alignment key, taken along a line "IXb—IXb" of FIG. 6A.

In FIG. 6A, a semiconductor layer 314 in a second region "VIIIb" has multiple holes 315 having a "]" shape. A buffer layer 312 (of FIG. 5C) under the semiconductor layer 314 is exposed through the holes 315. Each hole 315 may be used as an align pattern 316a, and the align patterns 316a constitute an alignment key 316. Even though the alignment key 316 has a "]" shape in the second embodiment, the alignment key 316 may have various shapes such as "|," "S," "E," "ĩ," "+" and "◊" in another embodiment. However, any suitable shape can be used.

FIG. 6B shows a buffer layer 312 that is formed over a substrate 310 and a semiconductor layer 314 of amorphous silicon is formed over the buffer layer 312. The semiconductor layer 314 has multiple holes 315 and each hole 315 is used as a concave-shaped alignment pattern 316a. The alignment patterns 316a constitute an alignment key 316. The number and shape of the alignment key 316 may be variously changed in another embodiment of the invention.

Figure 7:
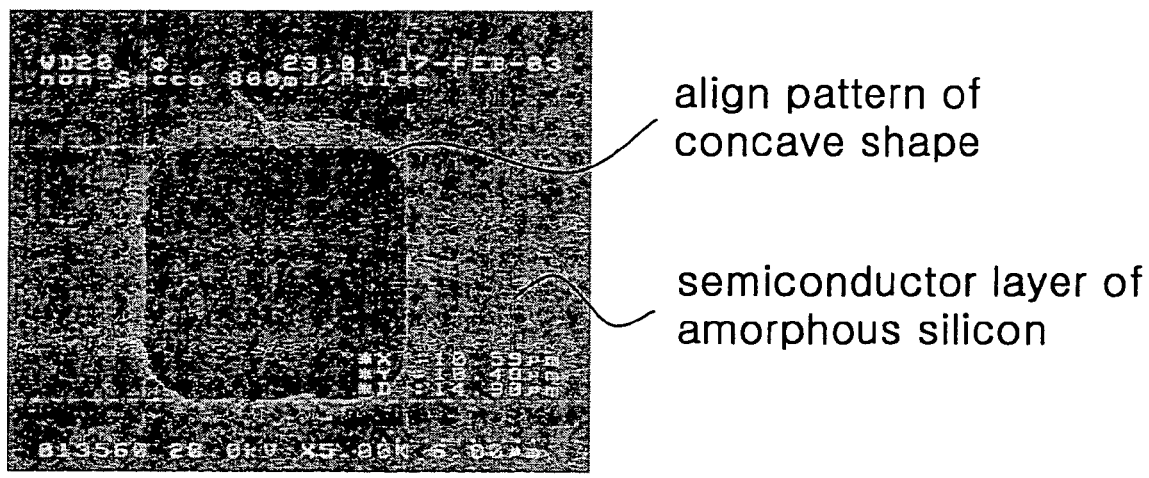
FIG. 7 shows an example of a plane image of an alignment key formed by the process of FIGS. 5A to 5C.

FIG. 7 shows an example of a plane image of an alignment key formed by the process of FIGS. 5A to 5C.

FIG. 7 illustrates an amorphous silicon semiconductor layer that has a concave-shaped alignment pattern. Since the alignment pattern has a concave shape, the alignment pattern has step portions against a buffer layer or a substrate, and the step portions are shown as white portions at the boundary of the alignment pattern. Since an exposure apparatus for photolithographic processing also recognizes the white portion, the alignment pattern may also be utilized in a photolithographic process.

Figure 8A:
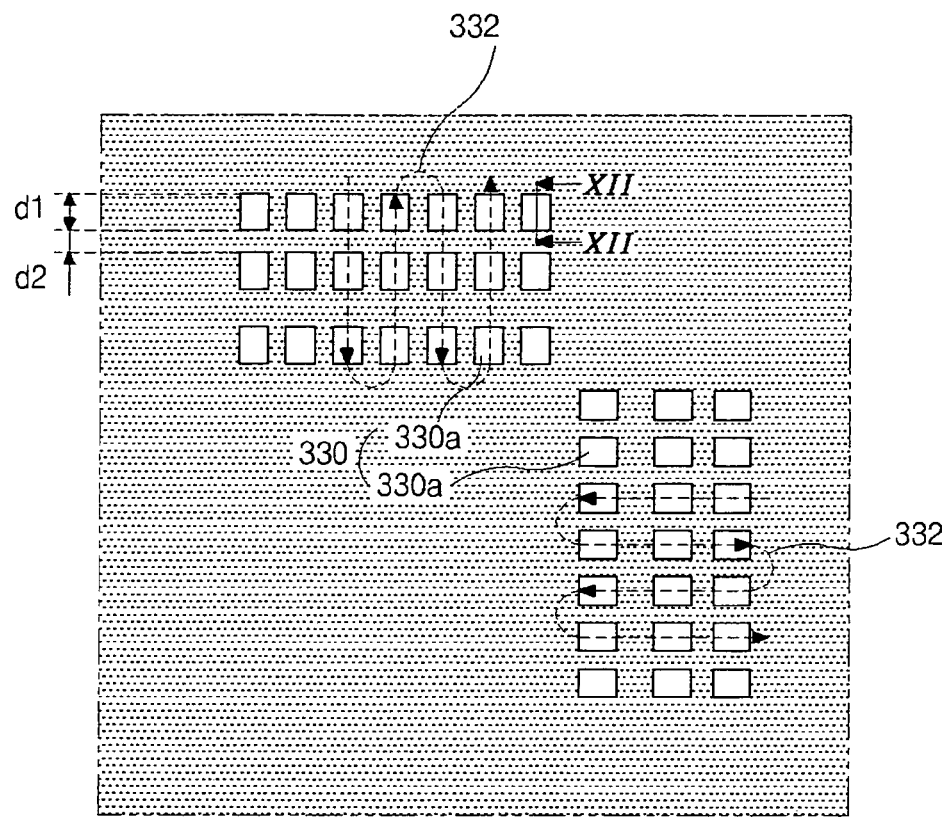
FIG. 8A shows a schematic plane view showing a process of recognizing an alignment key formed by the process of FIGS. 5A to 5C.

FIG. 8A shows a schematic plane view showing a process of recognizing an alignment key formed by the process of FIGS. 5A to 5C, and FIG. 8B presents a graph showing a result of recognizing an alignment key along a line "XII—XII" of FIG. 8A.

Figure 8B:
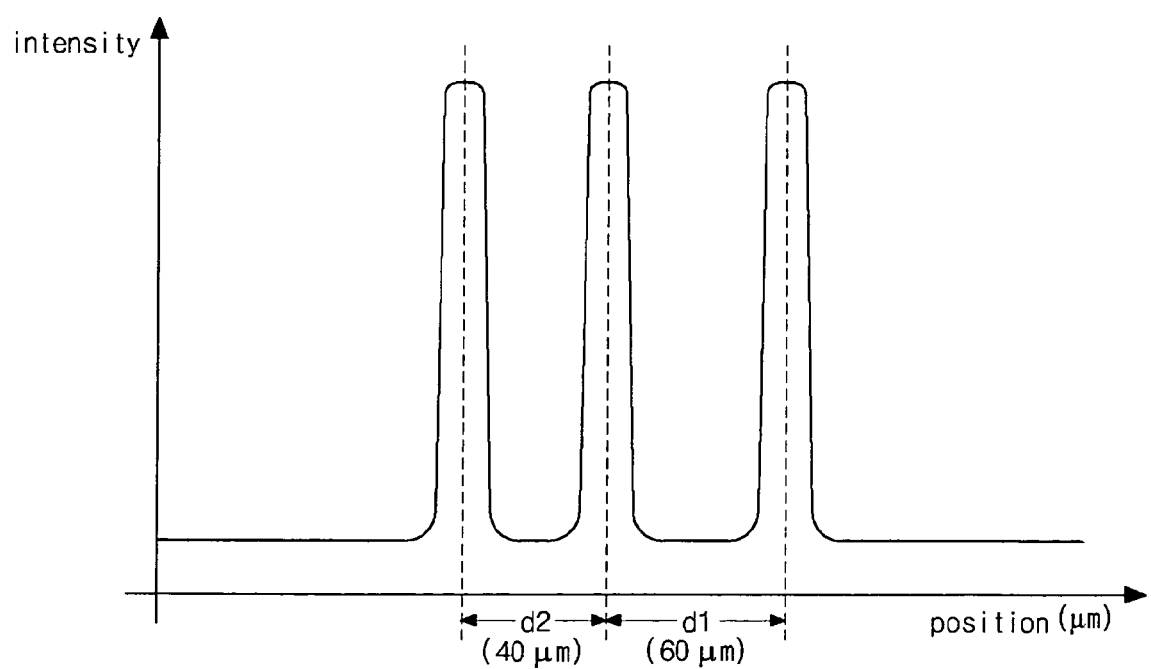
FIG. 8B illustrates a graph showing a result of recognizing an alignment key along a line "XII—XII" of FIG. 8A.

FIG. 8A shows an alignment key 330 having multiple alignment patterns 330a formed in a semiconductor layer. The alignment patterns 330a have a concave shape and are spaced apart from each other. In order to recognize the alignment key 330 in an exposure apparatus, a light source scans the semiconductor layer along a scanning path 332, and a receiver detects reflected light. For example, a space between adjacent alignment patterns 330a has a first width "d1" of about 60 µm and the alignment pattern 330a has a width of about 40 µm (a ratio of 3:2), and the result of recognizing the alignment pattern 330a is shown in FIG. 8B. As shown in FIG. 8B, when the alignment pattern 330a has a step at its boundary portion, the graph has peaks at a position corresponding to the step portions of the align pattern 330a. The X-axis indicates a one-dimensional position of the semiconductor layer, and the Y-axis indicates the intensity of light received at the receiver. In the graph, flat portions between peaks correspond to flat top surface of the semiconductor layer or a buffer layer (or a substrate) exposed through the align pattern 330a. The width "d1" is not restricted to 60 µm, and the invention can be practiced in a wide range, for example where "d1" is in a range of 20–100 µm. The width of the alignment pattern and the ratio are similarly not restricted.

Figure 9A:
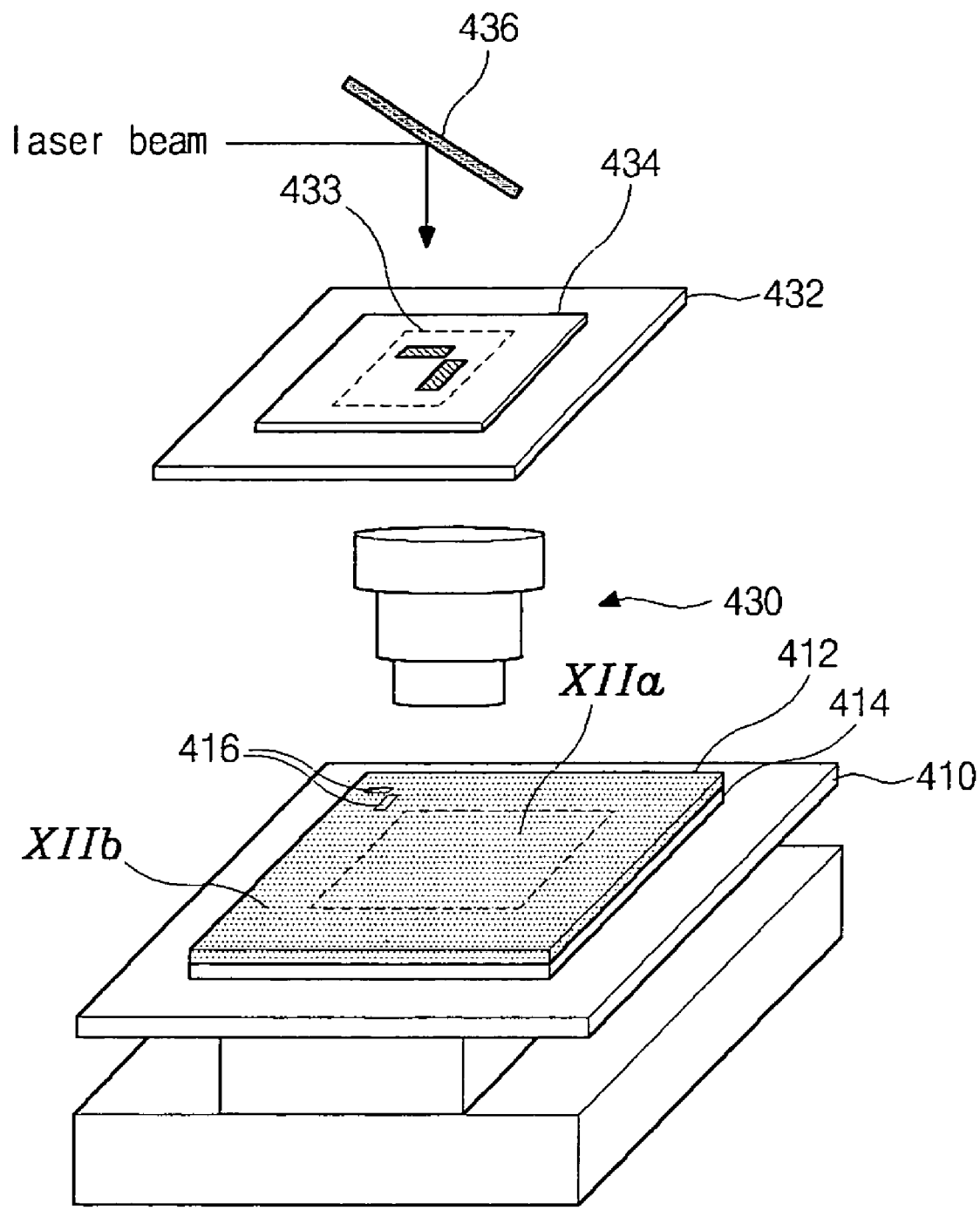
FIGS. 9A and 9B show schematic views illustrating a process of forming crystalline silicon using an alignment key according to a second embodiment of the invention.
Figure 9B:
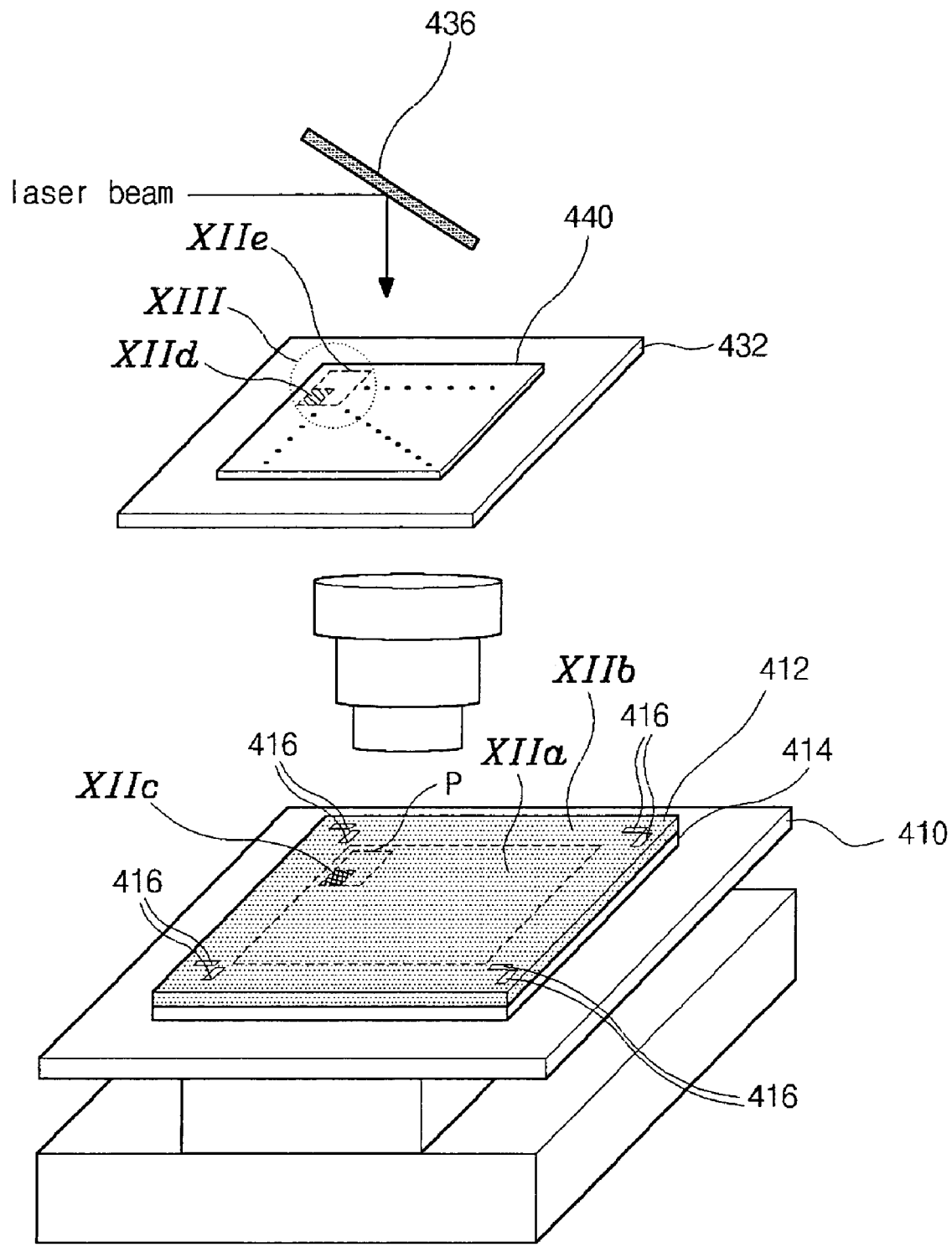

FIGS. 9A and 9B show schematic views illustrating a process of forming crystalline silicon using an alignment key according to a second embodiment of the invention.

In FIG. 9A, a substrate 414 having an amorphous silicon semiconductor layer 412 thereon is disposed on a moving stage 410. The substrate 414 includes a first region "XIIa" and a second region "XIIb" at the periphery of the first region "XIIa." Although a buffer layer is not shown, it can be provided between the substrate 414 and the semiconductor layer 412 as shown in FIG. 6B. A projection lens 430 focuser a laser beam with a specific magnification over the semiconductor layer 412, and a mask stage 432 is disposed over the projection lens 430. A mask 434 for forming an alignment key is disposed on the mask stage 432, and a mirror 436 for changing the direction of the laser beam is disposed over the mask 434.

The laser beam irradiated onto the amorphous silicon semiconductor layer 412 may have an energy density corresponding to an ablation regime, which is higher than an energy density corresponding to a complete melting regime. Accordingly, the exposed semiconductor layer 412 is removed by ablation to form a concave-shaped alignment key having step portions against the substrate 414. In addition, the energy density of the laser beam may be lower than the energy density corresponding to a critical distance of about 1 µm.

The mask 434 may have a mask pattern 433, and the mask 434 may be disposed to correspond to a first corner of the substrate 414. The mask pattern 433 may have various shapes in other embodiments of the invention. That is, the rectangles can be replaced with squares, circles, ovals, parallelepipeds, or other suitable shapes. A first concave-shaped alignment key 416 located at the first corner of the substrate 414 in the second region "XIIb" may be obtained by irradiating the laser beam through the mask 434. The other three alignment keys at the other three corner portions of the substrate 414 may be obtained by repeating the movement of the moving stage 410 and the irradiation of the laser beam. As a result, four concave-shaped alignment keys 416 may be obtained by ablating portions of the semiconductor layer 416 of amorphous silicon using the apparatus of FIG. 9A.

Since a laser apparatus used to crystallize a semiconductor layer of the first region "XIIa" in a subsequent process is used for forming the alignment key 416, the fabrication cost is reduced and process efficiency increases. The capitalization cost for an extra piece of equipment is also avoided. Even though not shown in FIG. 9A, the shape and size of the alignment key 416 and of the mask pattern 433 may be changed to a different shape and size as desired.

FIG. 9B shows the substrate 414 having the alignment key 416 is disposed on the moving stage 410, and the mask stage 432 is disposed over the substrate 414. A mask 440 for the pixel region is disposed on the mask stage 432. The mask 440 may have multiple first mask regions "XIIe" spaced apart from each other. Each first mask region "XIIe" may include a second mask region "XIId" and the second mask region "XIId" may have slits (not shown in FIG. 9B). The mirror 436 disposed over the mask 440 changes the path of the laser beam.

The mask 440 is aligned to the pixel regions "P" of the semiconductor layer 412 by using the concave-shaped alignment key 416, and the laser beam is irradiated onto the semiconductor layer 412 in the pixel regions "P" to selectively crystallize the semiconductor layer 412 in the pixel regions "P". That is, the position of the grain boundaries of the polycrystalline semiconductor layer 412 may be controlled and may be determined by using the concave-shaped alignment key 416 as a reference. Each first mask region "XIIe" corresponds to the pixel region "P" in the semiconductor layer 412, and each second mask region "XIId" corresponds to a third region "XIIc" for an active layer of a switching element. For example, the semiconductor layer 412 in the third region "XIIc" may be crystallized through a sequential lateral solidification (SLS) method.

Since the semiconductor layer 412 selectively crystallizes using the alignment keys 416, uniformity of crystallization results with precise control of the position of the grain boundaries. Moreover, since the concave-shaped alignment key 416 has steps against the substrate 414 (or buffer layer if present), the alignment key 416 can be recognized and used in a subsequent photolithographic process. Also, the concave-shaped alignment key 416 may be obtained by irradiating a laser beam without an additional etching step. Accordingly, an additional or separate alignment key for the photolithographic process is not needed, and the entire fabrication process for forming switching elements (such as thin film transistors) in a display device (such as a liquid crystal display) is simplified.

Figure 10A:
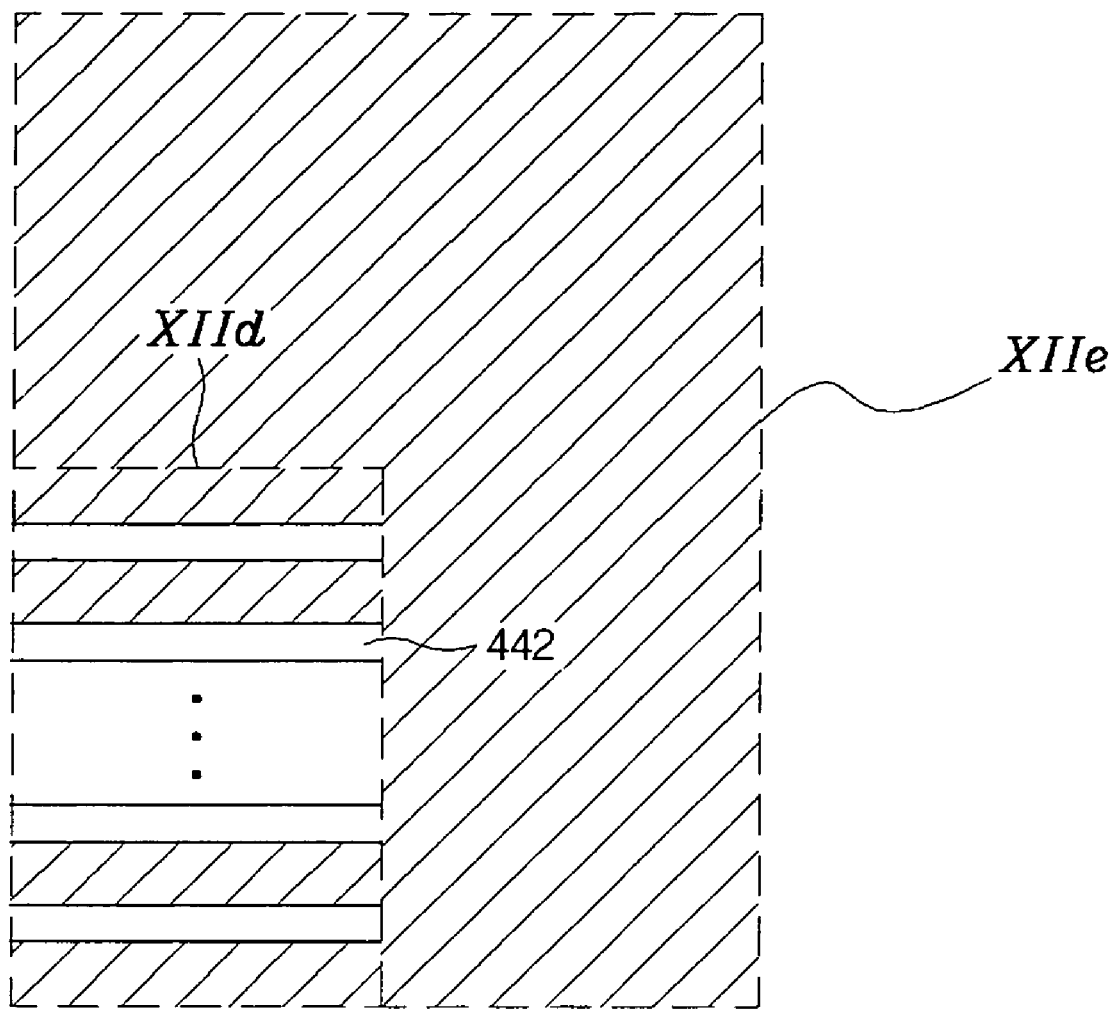
FIGS. 10A and 10B show magnified plane views of a portion "XIII" of FIG. 9B, which show two different examples of a first mask region "XIIe"
Figure 10B:
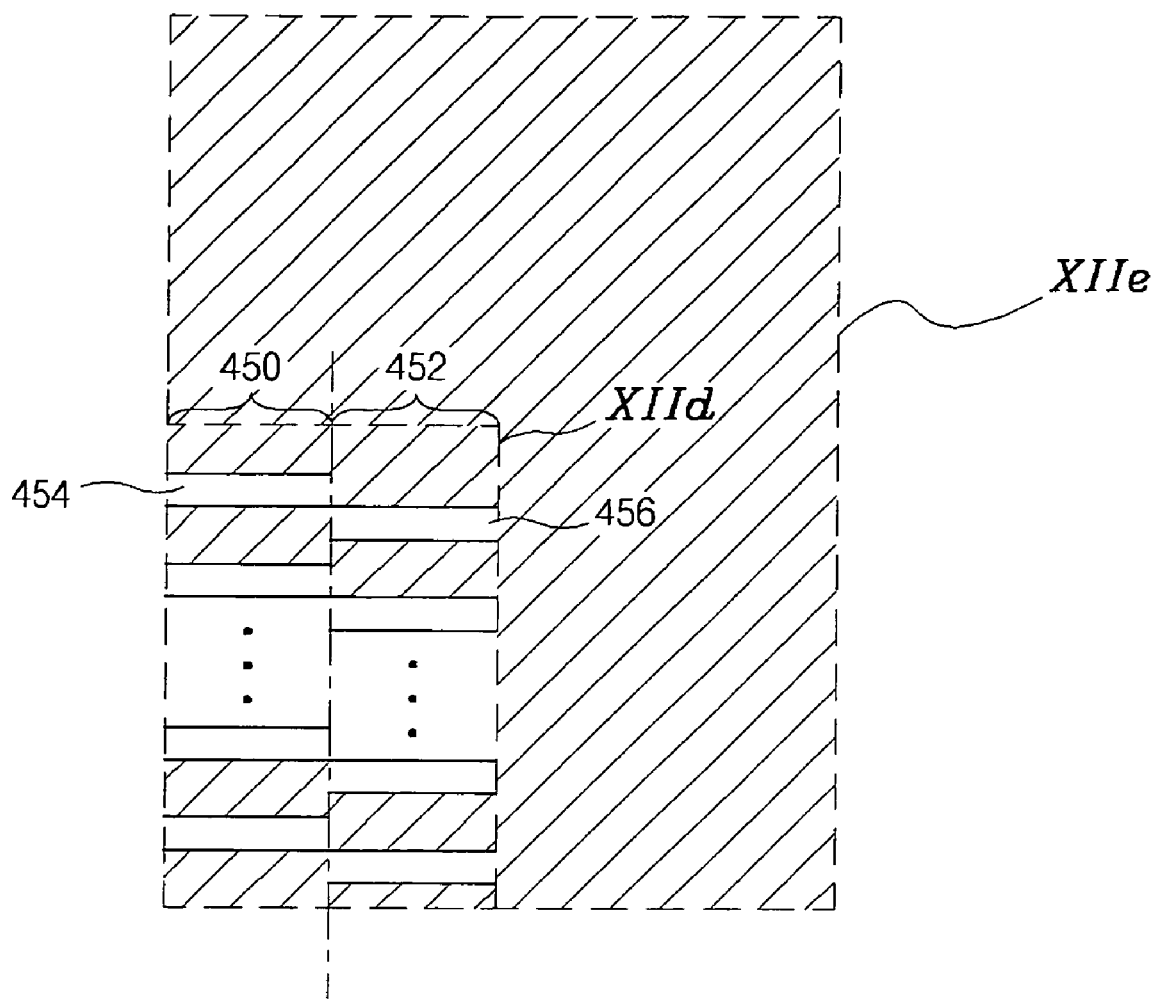

FIGS. 10A and 10B are magnified plane views of a portion "XIII" of FIG. 9B, which show two different examples of a first mask region "XIIe."

In FIG. 10A, each first mask region "XIIe" for forming the pixel regions includes a second mask region "XIId" having one block of slits 442. The slits 442 are spaced apart from each other and disposed along one direction. When such a mask for forming the pixel regions has one block of slits 442 used for crystallization of a semiconductor layer in the pixel regions, a laser beam can be irradiated onto the semiconductor layer along multiple directions, for example, in two perpendicular directions. This laser annealing method may be referred to as a multiple scan method. Other portions of the second mask region "XIId" in the first mask region "XIIe" shield the laser beam.

In another example as shown in FIG. 10B, each first mask region "XIIe" for forming the pixel regions includes a second mask region "XIId" having a first block 450 of first slits 454 and a second block 452 of second slits 456. The first slits 454 are spaced apart from each other and the second slits 456 are spaced apart from each other. The first slits 454 are alternately disposed with the second slits 456. When such a mask for forming the pixel regions has the first and second blocks 450 and 452 of first and second slits 454 and 456 used for crystallization of a semiconductor layer in the pixel regions, a laser beam can be irradiated onto the semiconductor layer along one direction, and this laser annealing method may be referred to as a single scan method. In the single scan method, the throughput of the crystallization process may be improved because the effects of two directional scan can now be obtained by one directional scan. Other portions of the second mask region "XIId" in the first mask region "XIIe" shield the laser beam.

Figure 11:
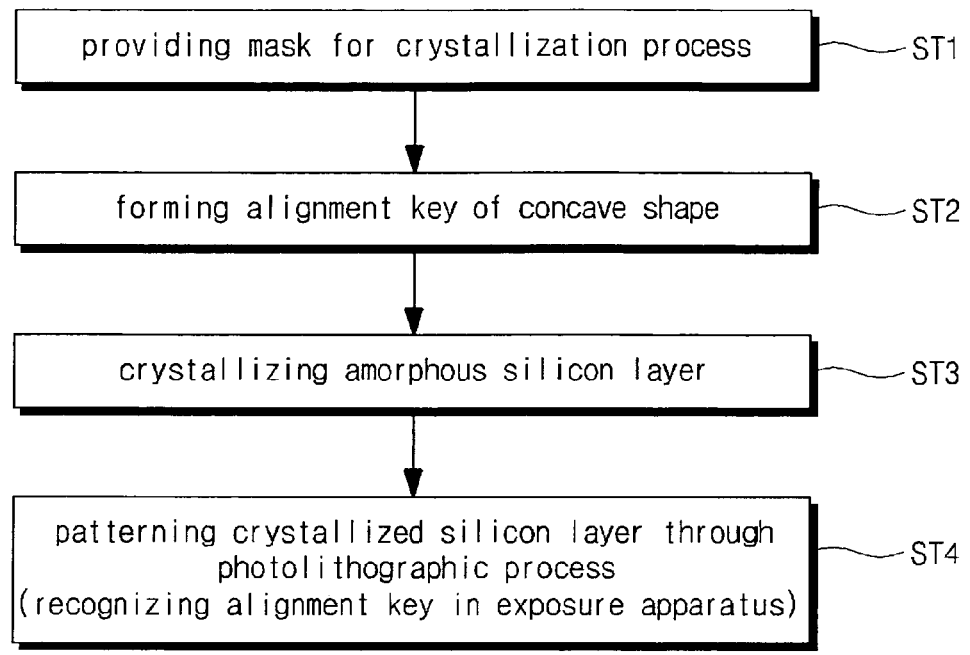
FIG. 11 shows a flow chart illustrating the method of fabricating crystalline silicon according to an embodiment of the invention.

FIG. 11 shows a flow chart illustrating the method of fabricating crystalline silicon according to an embodiment of the invention. The steps of this method can be implemented in the apparatus of FIGS. 9A and 9B using the masks shown in FIGS. 10A and 10B as discussed above.

Referring to FIG. 11, at ST1, masks for crystallization are provided. The masks for crystallization include a mask for forming an alignment key and a mask for crystallizing a semiconductor layer of amorphous silicon as discussed above. In addition, the masks for crystallization may include a mask for forming a driving region. For example, a mask having patterns for producing high crystallinity with low throughput may be used as the mask for forming a driving region of a display device. Moreover, the mask for forming an alignment key may have a pattern including multiple transmissive portions having rectangularly shaped areas. The multiple transmissive portions together may form a "]"-shaped configuration, but the invention is not limited to this configuration. The mask for forming pixel regions may have one or more transmissive portions that correspond to a switching element region of a semiconductor layer.

At ST2, a concave shape alignment key is formed at corners of a substrate by irradiating a laser beam onto an amorphous silicon semiconductor layer over the substrate, as discussed above. Since the laser beam has an energy density corresponding to an ablation regime, removing the exposed semiconductor layer by ablation forms the alignment key having a concave portion. The substrate (or a buffer layer if present) may be exposed through the alignment key and the alignment key may have a step against the substrate (or a buffer layer if present) at a boundary of the alignment key.

At ST3, the mask for pixel regions is aligned to the semiconductor layer using the alignment key, such that the transmissive portions of the mask for forming pixel regions corresponds to a region for a switching element, and a laser beam is irradiated through this mask onto the semiconductor layer in the region intended for a switching element. The crystallized semiconductor layer may then be used as an active layer of a switching element. Since the region for the switching element region is selectively crystallized, the crystallinity of the semiconductor layer significantly improves. Moreover, since the semiconductor layer is crystallized using the alignment key as a reference, the position of the grain boundary is readily controlled and thus prevents the crystallization of the semiconductor layer in an open region corresponding to a pixel electrode. Accordingly, defects in the buffer layer or the substrate due to the crystallization of the semiconductor layer are prevented, and staining of display images resulting from these defects is prevented.

The semiconductor layer in the region for a switching element can be crystallized through a sequential lateral solidification (SLS) method, where the laser beam has an energy density corresponding to a complete melting regime of silicon. In addition, a mask for forming a driving region may be aligned to correspond to a driving region surrounding the pixel regions by using the alignment key. The semiconductor layer in the driving region may be crystallized by irradiating a laser beam through this mask. Since the semiconductor layer in the driving region is crystallized using the alignment key as a reference, the position of the grain boundary is easily controlled. As a result, one observes great improvements in the properties of switching elements in a driving circuit and the driving circuit itself.

At ST4, the semiconductor layer having the crystalline silicon is then patterned to be a semiconductor layer (active layer) for a switching element, through a photolithographic process utilizing the same alignment key as a photo alignment key. The photolithographic process includes forming a photoresist (PR) layer on the semiconductor layer, forming a PR pattern through exposure and development of the PR layer, and patterning the semiconductor layer on the substrate using the PR pattern as an etch mask. In the exposure step, a mask for patterning the semiconductor layer is aligned using the same alignment key. Accordingly, an additional or separate alignment key for patterning the semiconductor layer to form the active layer of a switching element is not needed, and the entire process of fabricating switch elements and a liquid crystal display device becomes simpler.

Figure 12:
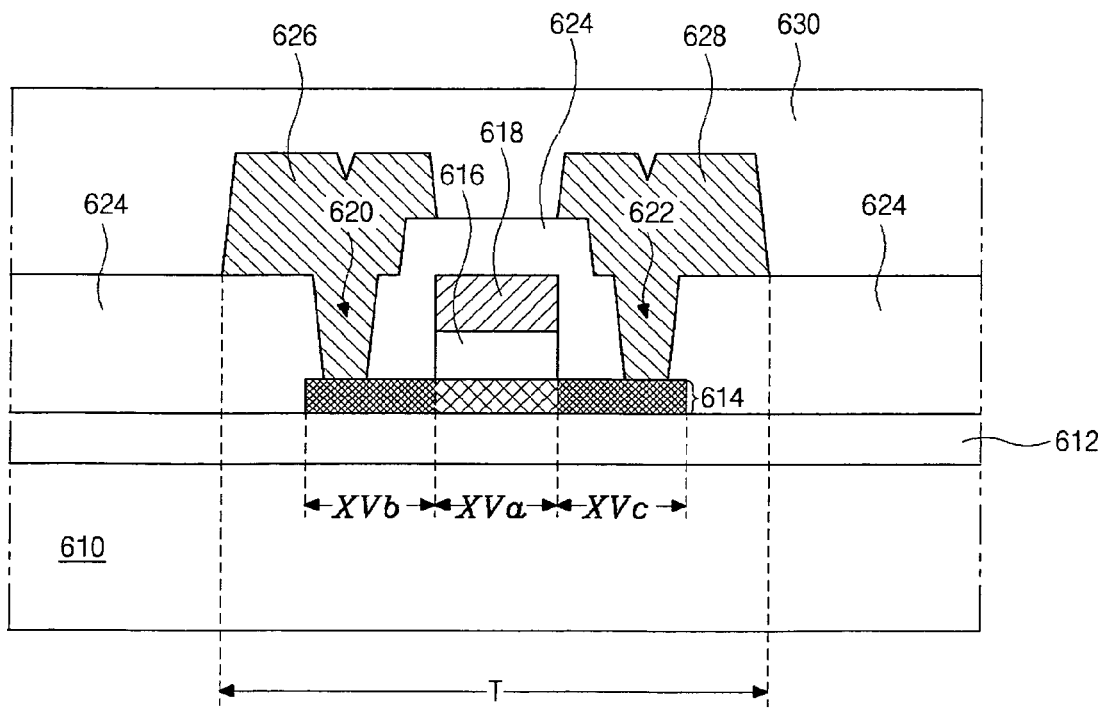
FIG. 12 shows a schematic cross-sectional view showing a switching element having crystalline silicon according to an embodiment of the invention.

FIG. 12 shows a schematic cross-sectional view showing a switching element having crystalline silicon according to an embodiment of the invention.

In FIG. 12, a buffer layer 612 is formed over a substrate 610 and a semiconductor layer (active layer) 614 of polycrystalline silicon is formed over the buffer layer 612. The semiconductor layer 614 of polycrystalline silicon can be formed using the crystallization and pattern methods discussed above, and includes a channel region "VII" and source and drain regions "VIII" and "IX" at both sides of the channel region "VII." A gate insulating layer 616 is formed over the semiconductor layer 614 in the channel region "VII", and a gate electrode 618 is formed over the gate insulating layer 616. An interlayer insulating layer 624 is formed over the gate electrode 618 and over the buffer layer 612. The interlayer insulating layer 624 includes first and second contact holes 620 and 622. The first and second contact holes 620 and 622 expose the semiconductor layer 614 in the source and drain regions "VIII" and "IX," respectively. Source and drain electrodes 626 and 628 are formed over the interlayer insulating layer 624. The source electrode 626 electrically connects to the semiconductor layer 614 in the source region "VIII" through the first contact hole 620, and the drain electrode 628 electrically connects to the semiconductor layer 614 in the drain region "IX" through the second contact hole 622. A passivation layer 630 is formed over the source and drain electrodes 626 and 628. The semiconductor layer 614 in the source and drain regions "VIII" and "IX" is doped with impurities of n(negative)-type or p(positive)-type.

As discussed above, the semiconductor layer 614 may be formed by using the crystallization process according to the various embodiments of the invention. For example, single crystalline silicon may be used for the semiconductor layer 614 through a sequential lateral solidification (SLS) method. The semiconductor layer 614, the gate electrode 618, the source electrode 626 and the drain electrode 628 constitute a switching element "T" such as a thin film transistor TFT.

In the invention, since a semiconductor layer is selectively crystallized using a concave shape alignment key, uniformity in the crystallization properties improves and the position of the grain boundaries is controlled easily and with precision. As a result, the driving properties of the driving circuit improves due to the easy position control of the grain boundaries of a semiconductor layer, and the display quality of a display device using the semiconductor layer improves due to the selective crystallization. Moreover, since an alignment key is obtained by removing a semiconductor layer by ablation, the alignment key has steps against the substrate or buffer layer. Accordingly, the concave shape alignment key can be used for both the crystallization process and a photolithographic process of a semiconductor layer. Therefore, additional or separate alignment keys for the photolithographic process are not needed, and the entire process of forming a switching element such as a TFT is simplified.

The inventive method of forming pixel regions, switching elements and driving regions can be used to from a liquid crystal display panel/device or other suitable devices.

While the invention has been particularly shown and described with reference to an illustrated embodiment thereof, it will be understood by those skilled in the art that the foregoing and other changes in form and details may be made therein without departing from the spirit and scope of the invention.

What is claimed is:

1. A method of forming a crystalline silicon layer, comprising: providing a substrate having a first region and a second region at a periphery of the first region;
   forming an amorphous silicon semiconductor layer over the substrate;
   forming at least one alignment key of a concave shape by irradiating a laser beam onto the amorphous silicon semiconductor layer in the second region; and
   crystallizing the semiconductor layer in the first region using the at least one alignment key.

2. The method of claim 1, wherein the laser beam has an energy density corresponding to an ablation regime where the semiconductor layer is removed by evaporation.

3. The method of claim 1, wherein the laser beam has a first energy density higher than a second energy density corresponding to a complete melting regime where the semiconductor layer is completely melted, and the first energy density is lower than a third energy density such that a critical distance from a boundary of the laser beam to a boundary of the at least one alignment key is about 1 μm.

4. The method of claim 1, wherein the step of crystallizing the semiconductor layer selectively forms an active layer of crystalline silicon for a switching element.

5. The method of claim 1, wherein the at least one alignment key is formed at four corners of the substrate in the second region.

6. The method of claim 1, further comprising forming a buffer layer between the substrate and the semiconductor layer.

7. The method of claim 1, wherein the substrate is exposed through the at least one alignment key.

8. The method of claim 1, wherein the at least one alignment key includes a plurality of concave-shaped alignment patterns spaced apart from each other.

9. The method of claim 1, wherein the step of forming the at least one alignment key and the step of crystallizing the semiconductor layer are performed using the same laser apparatus.

10. A method of forming an active layer for a switching element, comprising:
    providing a substrate having a first region and a second region at a periphery of the first region;
    forming an amorphous silicon semiconductor layer over the substrate;
    forming at least one concave-shaped alignment key by irradiating a laser beam onto the amorphous silicon semiconductor layer in the second region;
    crystallizing the semiconductor layer in the first region using the at least one alignment key; and
    patterning the semiconductor layer in the first region using the at least one alignment key to form the active layer from crystalline silicon.

11. The method of claim 10, wherein the step of patterning the semiconductor layer includes an exposure step of recognizing the at least one alignment key by scanning.

12. A method of forming a crystalline silicon layer, comprising:
    providing a substrate having a first region and a second region at a periphery of the first region;
    forming an amorphous silicon semiconductor layer over the substrate;
    forming at least one concave-shaped alignment key using a first mask by irradiating a laser beam onto the amorphous silicon semiconductor layer in the second region; and
    crystallizing the semiconductor layer in the first region using the at least one alignment key and a second mask.

13. The method of claim 12, wherein the first mask includes a plurality of transmissive areas that are spaced apart from each other, each transmissive area having a rectangular shape.

14. The method of claim 12, further comprising forming a buffer layer between the substrate and the semiconductor layer.

15. The method of claim 12, wherein the substrate is exposed through the at least one alignment key.

16. The method of claim 12, wherein the at least one alignment key is formed at four corners of the substrate in the second region.

17. The method of claim 12, wherein the second mask includes a first mask region shielding the laser and a second mask region transmitting the laser beam.

18. The method of claim 17, wherein the second mask region includes a plurality of slits spaced apart from each other and disposed along one direction.

19. The method of claim 18, wherein the plurality of slits include first slits and second slits alternating with the first slits.

20. The method of claim 12, wherein the step of forming the at least one alignment key and the step of crystallizing the semiconductor layer are performed using the same laser apparatus including a moving stage having the substrate thereon, a projection lens focusing the laser beam, a mask stage having one of the first and second masks thereon and a mirror changing a direction of the laser beam.

21. A method of forming an active layer for a switching element, comprising:
providing a substrate having a first region and a second region at a periphery of the first region;
forming an amorphous silicon semiconductor layer over the substrate;
forming at least one alignment key of a concave shape using a first mask by irradiating a laser beam onto the amorphous silicon semiconductor layer in the second region;
crystallizing the semiconductor layer in the first region using the at least one alignment key and a second mask; and
patterning the semiconductor layer in the first region using the at least one alignment key to form the active layer of crystalline silicon.

22. The method of claim 21, wherein the step of patterning the semiconductor layer includes an exposure step of recognizing the at least one alignment key by scanning.

23. The method of claim 21, wherein the laser beam has an energy density corresponding to an ablation regime where the semiconductor layer is removed by evaporation.

24. The method of claim 21, wherein the laser beam has a first energy density higher than a second energy density corresponding to a complete melting regime where the semiconductor layer is completely melted, and the first energy density is lower than a third energy density such that a critical distance from a boundary of the laser beam to a boundary of the at least one alignment key is about 1 μm.

25. A method for fabricating a switching element, comprising:
providing a substrate having a first region and a second region at a periphery of the first region;
forming an amorphous silicon semiconductor layer over the substrate;
forming at least one concave-shaped alignment key by irradiating a laser beam onto the amorphous silicon semiconductor layer in the second region;
crystallizing the semiconductor layer in the first region using the at least one alignment key;
patterning the semiconductor layer in the first region using the at least one alignment key to form an active layer of crystalline silicon including a channel region and source and drain regions at sides of the channel region;
forming a gate insulating layer over the active layer;
forming a gate electrode over the gate insulating layer;
forming an interlayer insulating layer over the gate electrode, the interlayer insulating layer including a first contact hole exposing the source region and a second contact hole exposing the drain region; and
forming source and drain electrodes over the interlayer insulating layer, the source electrode being connected to the source region through the first contact hole and the drain electrode being connected to the drain region through the second contact hole.

26. The method of claim 25, further comprising forming a buffer layer between the substrate and the semiconductor layer.

27. The method of claim 25, further comprising forming a passivation layer over the source and drain electrodes.

28. The method of claim 25, wherein the source and drain regions are doped with one of n(negative)-type impurities and p(positive)-type impurities.

29. The method of claim 25, wherein the active layer, the gate electrode, the source electrode and the drain electrode comprise a thin film transistor.

30. A method of forming a polycrystalline semiconductor layer, comprising:
providing a substrate having a first region and a second region at a periphery of the first region;
forming an amorphous silicon semiconductor layer over the substrate;
ablating the amorphous silicon semiconductor layer in the second region to form at least one concave-shaped alignment key; and
crystallizing the semiconductor layer in the first region using the at least one alignment key.

31. The method of claim 30, wherein the step of ablating the semiconductor layer includes irradiating a laser beam having a first energy density onto the semiconductor layer in the second region.

32. The method of claim 31, wherein the first energy density is higher than a second energy density corresponding to a complete melting regime where the semiconductor layer is completely melted, and the first energy density is lower than a third energy density such that a critical distance from a boundary of the laser beam to a boundary of the at least one alignment key is about 1 μm.

33. The method of claim 30, wherein the at least one alignment key has a step against the substrate.

34. A switching element, comprising:
a substrate having a first region and a second region at a periphery of the first region;
at least one concave-shaped alignment key formed from an amorphous silicon semiconductor layer in the second region;
an active layer of crystalline silicon in the first region, the active layer including a channel region and source and drain regions at sides of the channel region;
a gate insulating layer over the active layer;
a gate electrode over the gate insulating layer;
an interlayer insulating layer over the gate electrode, the interlayer insulating layer including a first contact hole exposing the source region and a second contact hole exposing the drain region; and
source and drain electrodes over the interlayer insulating layer, the source electrode being connected to the source region through the first contact hole and the drain electrode being connected to the drain region through the second contact hole.

35. The element of claim 34, wherein the active layer is aligned to the at least one alignment key.

* * * * *